United States Patent
Furukawa et al.

(10) Patent No.: US 7,764,007 B2
(45) Date of Patent: Jul. 27, 2010

(54) UNDER BUMP METAL FILM COMPRISING A STRESS RELAXATION LAYER AND A DIFFUSION-RESISTANT LAYER

(75) Inventors: Mitsuhiro Furukawa, Hyogo (JP); Atsushi Takano, Osaka (JP)

(73) Assignee: Panasonic Corporation, Osaka (JP)

( * ) Notice: Subject to any disclaimer, the term of this patent is extended or adjusted under 35 U.S.C. 154(b) by 219 days.

(21) Appl. No.: 11/817,171

(22) PCT Filed: Mar. 7, 2006

(86) PCT No.: PCT/JP2006/304340
§ 371 (c)(1),
(2), (4) Date: Aug. 27, 2007

(87) PCT Pub. No.: WO2006/100900
PCT Pub. Date: Sep. 28, 2006

(65) Prior Publication Data
US 2009/0021109 A1    Jan. 22, 2009

(30) Foreign Application Priority Data
Mar. 22, 2005    (JP) .............................. 2005-080945

(51) Int. Cl.
*H01L 41/047*    (2006.01)

(52) U.S. Cl. .................. 310/365; 310/363; 310/364
(58) Field of Classification Search .......... 310/363–366
See application file for complete search history.

(56) References Cited

U.S. PATENT DOCUMENTS

| 6,404,110 B1 * | 6/2002 | Nakashima et al. ......... 310/364 |
| 2004/0080049 A1 | 4/2004 | Kim |
| 2005/0224974 A1 * | 10/2005 | Nishida et al. ............... 257/737 |
| 2007/0013067 A1 * | 1/2007 | Nishida et al. ............... 257/737 |

FOREIGN PATENT DOCUMENTS

| JP | 08-307192 | 11/1996 |
| JP | 10013184 A * | 1/1998 |
| JP | 11-234082 | 8/1999 |
| JP | 2003-032071 | 1/2003 |
| JP | 2003-318212 | 11/2003 |
| JP | 2003-318212 A | 11/2003 |

OTHER PUBLICATIONS

International Search Report Dated Jun. 13, 2006.
Chinese Office Action.

* cited by examiner

*Primary Examiner*—J. SanMartin
(74) *Attorney, Agent, or Firm*—Pearne & Gordon LLP

(57) ABSTRACT

An under bump metal film formed on a substrate includes a diffusion-resistant barrier layer made of a platinum group metal film, and an aluminum-based stress relaxation layer formed under the diffusion-resistant barrier layer.

6 Claims, 2 Drawing Sheets

UNDER BUMP METAL FILM COMPRISING A STRESS RELAXATION LAYER AND A DIFFUSION-RESISTANT LAYER

This application is a U.S. national phase application of PCT international application PCT/JP06/304340, filed Mar. 7, 2006.

TECHNICAL FIELD

The present invention relates to an under bump metal film (hereinafter referred to as metal film) formed by evaporation-liftoff so as to have excellent adhesion and reliability, a method for forming the metal film, and a surface acoustic wave device.

BACKGROUND ART

Semiconductor devices and surface acoustic wave devices, which are used in various electronic devices such as mobile communication terminal devices in recent years, have been required to be smaller and lower height along with the increasing miniaturization of such electronic devices.

In order to meet this requirement by reducing mounting area and height of the semiconductor devices and the surface acoustic wave devices, flip-chip mounting is often used to connect these elements face-down to a mounting substrate or to a package having bumps such as solder bumps formed thereon.

The semiconductor devices and the surface acoustic wave devices often include an electrode wiring made of aluminum or aluminum alloy. Such an aluminum-based electrode wiring, however, is so poorly wettable to solder that they cannot be well bonded to each other. For this reason, it is necessary to provide a metal film between the solder bumps and the electrode wiring so as to improve the bonding.

Recent environmental issues are accelerating the use of lead-free solder bumps. However, SnAgCu lead-free solder has a higher reflow temperature and a higher Sn content than the conventional PbSn eutectic solder. Since Sn diffuses easily, it is necessary to solve the problem of the diffusion of the metal film and Sn.

The metal film is generally formed by plating, evaporation-liftoff, or the like. Plating is often used in cases where a photo-resist used as a mask can be left on the substrate without being removed after the plating, because the photo-resist needs to have high chemical resistance. Plating is, however, not suitable for the surface acoustic wave devices because the photo-resist damps the vibration of comb-shaped electrodes and cannot be left on the substrate. Plating also involves problems such as difficulties in refining patterns and a treatment of waste fluid.

In view of this, the metal film of the surface acoustic wave devices is suitably formed by evaporation-liftoff. As described above, the use of SnAgCu solder requires a metal film having a high diffusion resistance. Therefore, the metal film needs to contain a thick barrier layer to prevent the diffusion of Sn. A well-known metallic material having an effect of preventing the diffusion of Sn is nickel.

However, if the thick barrier layer is formed of nickel having a high tensile stress, the photo-resist is likely to be cracked or exfoliated during the deposition of the metal film. Furthermore, the stress is concentrated on the interface between the photo-resist and the metal film, so that if a small load is applied from outside, the metal film is easily exfoliated.

On the other hand, it has been proposed to form a diffusion-resistant barrier layer of nickel having a thickness of 500 to 5000 nm by using a photo-resist pattern that is resistant to nickel stress. The photo-resist pattern is made from a special photo-resist material having a high stress resistance. It is likely that damage of the photo-resist can be reduced by making the photo-resist more resistant to the stress of the thick nickel film. However, the metal film is easily exfoliated by an external load due to the residual stress of the metal film formed on the substrate.

One of the prior arts related to the present application is Japanese Patent Unexamined. Publication No. 2003-318212.

SUMMARY OF THE INVENTION

The present invention is directed to provide an under bump metal film formed on a substrate. The under bump metal film includes a diffusion-resistant barrier layer and a stress relaxation layer. The diffusion-resistant barrier layer is made of a platinum group metal film. The stress relaxation layer is formed under the diffusion-resistant barrier layer and aluminum-based. The present invention enables the diffusion-resistant barrier layer having a sufficient thickness to be resistant to lead-free solder and also having a low residual stress to be formed by evaporation-liftoff. The evaporation-liftoff technique can refine the metal film and simplify a fabrication process of the under bump metal film.

Figure 1:
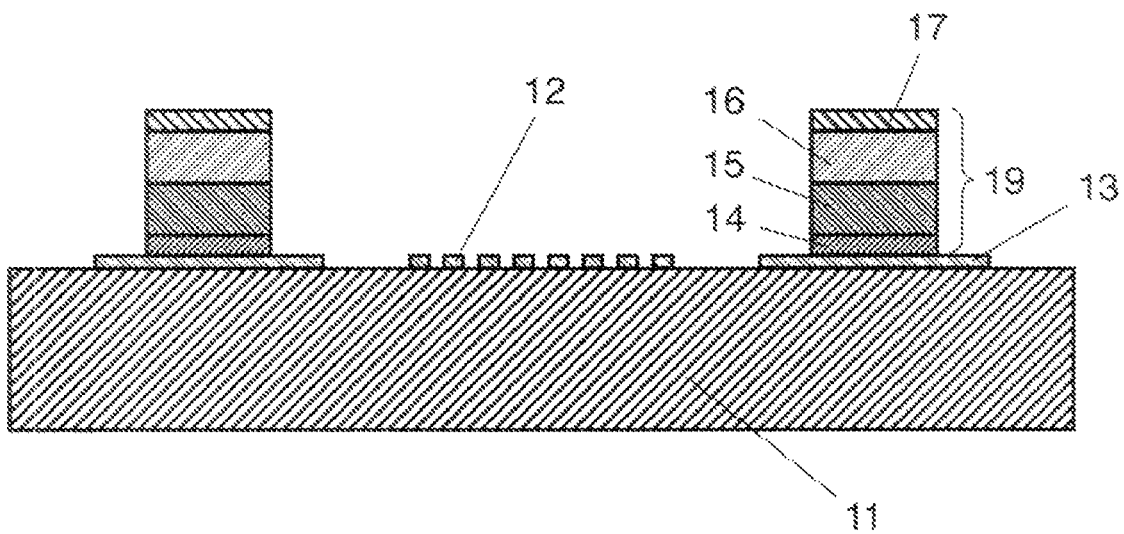
FIG. 1 is a sectional view of a surface acoustic wave device according to an embodiment of the present invention.

REFERENCE MARKS IN THE DRAWINGS 11, 21 piezoelectric substrate
12 comb-shaped electrode
13, 23 pad electrode
14, 24 adhesive layer
15, 25 stress relaxation layer
16, 26 diffusion-resistant barrier layer
17, 27 solder wetting layer
19, 29 under bump metal film

DETAILED DESCRIPTION OF PREFERRED EMBODIMENT

FIG. 1 is a sectional view of a surface acoustic wave device according to an embodiment of the present invention. The sectional view shows piezoelectric substrate 11 of lithium tantalate as a base. Comb-shaped electrodes 12 and pad electrodes 13 are formed on piezoelectric substrate 11. Comb-shaped electrodes 12 and pad electrodes 13 are made of aluminum doped with about 1% of copper and have a thickness of about 200 nm. On each pad electrode 13 are formed adhesive layer 14 made of titanium and having a thickness of about 100 nm; stress relaxation layer 15 made of aluminum and having a thickness of about 1000 nm; diffusion-resistant barrier layer 16 made of nickel and having a thickness of about 1000 nm; and solder wetting layer 17 made of gold and having a thickness of about 100 nm in that order. Thus, under bump metal film 19 includes four layers: adhesive layer 14, stress relaxation layer 15, diffusion-resistant barrier layer 16, and solder wetting layer 17.

The aluminum film, which is stress relaxation layer 15 having a compressive stress, is formed under the nickel film, which is diffusion-resistant barrier layer 16 having a high tensile stress. As a result, the tensile stress of the nickel film is compensated by the compressive stress of the aluminum film.

If stress relaxation layer 15 is made of a metal film having a low plasticity, the stress is concentrated on the interface between metal film 19 and the photo-resist, thereby easily causing the exfoliation of metal film 19 from the interface. In contrast, when stress relaxation layer 15 is made of the aluminum film, which has a high plasticity, the stress is less concentrated on the interface. Thus, the presence of the aluminum film in metal film 19 can prevent the stress of metal film 19 from being concentrated on the interface between the photo-resist and metal film 19 formed on the photo-resist.

On the other hand, in metal film 19 formed on piezoelectric substrate 11, the stress is concentrated on the interface between the bump pad electrodes and metal film 19. However, the presence of the aluminum film as stress relaxation layer 15 in metal film 19 can reduce the stress concentration on the interface, thereby preventing the exfoliation of metal film 19 due to the internal stresses.

According to the present invention, metal film 19 can have a diffusion preventing effect even to SnAgCu lead-free solder. Diffusion-resistant barrier layer 16 can be made of a platinum group metal such as platinum or palladium, instead of nickel.

It has been confirmed through experiments that diffusion-resistant barrier layer 16, which is provided to cope with the lead-free solder, needs to have a minimum thickness of 800 nm when made of nickel. When the thickness is smaller than this, the lead-free solder and the nickel diffuse, thereby decreasing the adhesive strength of the solder bumps. On the other hand, the thicker the nickel film of diffusion-resistant barrier layer 16, the better. However, when the film of nickel having a high tensile stress is formed thick as diffusion-resistant barrier layer 16, the stress is concentrated on the interface between metal film 19 and the photo-resist or the bump pad electrodes due to the internal stresses. This increases the risk of the photo-resist being exfoliated during manufacture or metal film 19 being exfoliated after a surface acoustic wave device product is complete. In conclusion, diffusion-resistant barrier layer 16 is preferably 800 nm to 2000 nm thick.

In order to cope with the nickel film having a high tensile stress, the aluminum film as stress relaxation layer 15 is preferably at least half and at most 1.5 times as thick as the nickel film. If the thickness is smaller than this, when the aluminum film is formed by deposition, the aluminum film has a small particle diameter and shows peculiar functions as a thin film more remarkably than the intrinsic plasticity of aluminum. As a result, the aluminum film becomes hard and the stress tends to be concentrated on the interface between diffusion-resistant barrier layer 16 and stress relaxation layer 15. On the other hand, the thicker the aluminum film as stress relaxation layer 15, the better. However, an increase in the thickness of the aluminum film causes a significant growth of aluminum particles so as to increase the surface roughness of the aluminum film and hence of the nickel film formed thereon. This reduces the effect of preventing the diffusion of Sn. In conclusion, stress relaxation layer 15 is preferably at least half and at most 1.5 times as thick as diffusion-resistant barrier layer 16.

Stress relaxation layer 15 is preferably made of 100% aluminum, but can be doped with small amounts of another metal depending on the forming process.

In the embodiment, metal film 19 includes four layers: adhesive layer 14, stress relaxation layer 15, diffusion-resistant barrier layer 16, and solder wetting layer 17. However, the essential component of the present invention is metal film 19 including diffusion-resistant barrier layer 16 and stress relaxation layer 15 formed directly under diffusion-resistant barrier layer 16. Adhesive layer 14 and solder wetting layer 17 are omitted if necessary. It is also possible to form more than one diffusion-resistant barrier layer 16.

As described above, under bump metal film 19 is formed on pad electrode 13 which is on piezoelectric substrate 11. On metal film 19 are provided solder bumps so that a surface acoustic wave device is mounted on a mounting substrate by flip-chip mounting.

FIGS. 2A to 2E are sectional views showing steps of forming the under bump metal film according to the embodiment of the present invention.

Figure 2A:
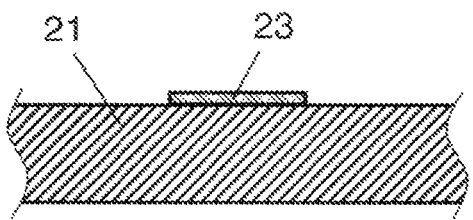
FIG. 2A is a sectional view showing a step of forming an under bump metal film according to the embodiment.

First of all, in the step shown in FIG. 2A, piezoelectric substrate 21 is formed of quartz, $LiTaO_3$, $LiNbO_3$, $Li_2B_4O_7$, or the like.

Next, comb-shaped electrodes (unillustrated) and pad electrodes 23 are formed on piezoelectric substrate 21 in an unillustrated step as follows. An electrode film made of an aluminum-copper alloy is formed as thick as about 200 nm by sputtering on an entire surface of piezoelectric substrate 21, which is previously cleaned. Then, a photo-resist film is applied on the electrode film, and a pattern of the comb-shaped electrodes and the pad electrodes is transferred to the photo-resist film by photolithographic techniques, thereby forming a photo-resist pattern. The unnecessary portion of the aluminum-copper electrode film is removed by etching using a chlorine-based etching gas. Then, the photo-resist, which is not necessary any more, is removed by ashing using oxygen plasma. As a result, a desired pattern of the comb-shaped electrodes and the pad electrodes formed of the aluminum-copper electrode film is formed on the piezoelectric substrate.

The comb-shaped electrodes and pad electrodes 23 may be alternatively formed by an evaporation-liftoff process having the steps of photo-resist patterning, film-forming (deposition or sputtering), and lift-off.

Figure 2B:
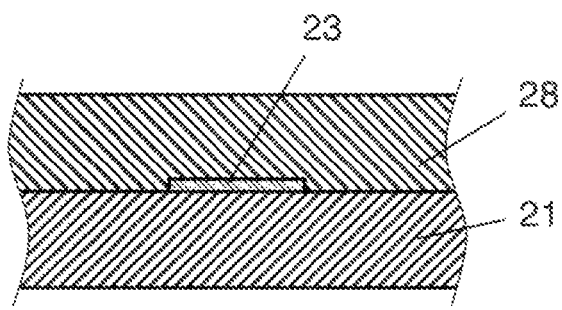
FIG. 2B is a sectional view showing another step of forming the under bump metal film according to the embodiment.

Next, as shown in FIG. 2B, lift-off photo-resist 28 (hereinafter referred to as photo-resist 28) is formed on piezoelectric substrate 21. Photo-resist 28 is made of an image-reversal type positive photo-resist (hereinafter referred to as positive photo-resist). When the positive photo-resist is used, its opening has an inverse-tapered cross section suitable for lift-off technique.

The positive photo-resist is applied to have a thickness of about 5 μm using a spin coater, and then baked for 60 seconds on a hot plate heated to 105° C.

Next, a photomask is placed on piezoelectric substrate 21 having photo-resist 28 applied thereon. Photo-resist 28 is exposed to ultraviolet light (i-ray of a high pressure mercury vapor lamp) via the photomask. The positive photo-resist is used with a photomask having a negative pattern.

The exposed positive photo-resist, which contains acid generated therein, is baked (reversal-baked) for 60 seconds on a hot plate heated to 115° C. In the acid-containing region of the photo-resist, the acid causes decomposition and cross-linking reactions, thereby greatly decreasing the dissolution rate of the photo-resist into a developing solution.

After this, the entire surface of piezoelectric substrate 21 thus reversal-baked is exposed to ultraviolet light (i-ray of a high pressure mercury vapor lamp). In the region not causing the cross-linking reaction, photo-resist 28 is exposed as well as the normal positive photo-resist and dissolved into the developing solution at a higher dissolution rate.

Next, piezoelectric substrate 21 having photo-resist 28 thereon is immersed in a TMAH (Tetra-Methyl-Ammonium-Hydroxide)-based developing solution for about 120 seconds (puddle development) so as to form lift-off photo-resist pattern 28a (hereinafter referred to as pattern 28a). Pattern 28a has a plurality of openings in each of which a predetermined metal film is formed. When photo-resist 28 is a positive photo-resist, its surface is heavily exposed during the pattern exposure before the reversal-baking. In contrast, the bottom side of photo-resist 28, that is, the interface side with piezoelectric substrate 21 is not well exposed to the ultraviolet light. Thus, when reversal-baking is performed, the surface of photo-resist 28 is heavily exposed, so that acid is generated at high concentration. This accelerates the cross-linking reaction, thereby decreasing the development rate in a wide region of photo-resist 28. On the other hand, when reversal-baking is performed, the interface side of photo-resist 28 with piezoelectric substrate 21 is less exposed, so that acid has a low concentration, causing only a small cross-linking reaction and having a relatively high development rate.

Figure 2C:
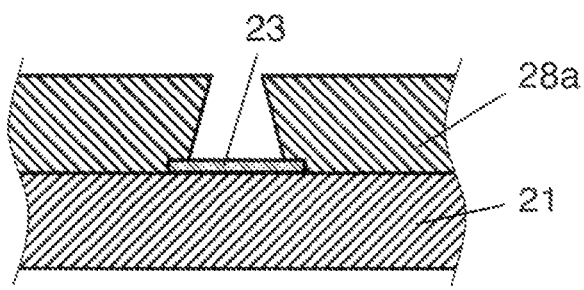
FIG. 2C is a sectional view showing another step of forming the under bump metal film according to the embodiment.

As described above, when the positive photo-resist is used, photo-resist pattern 28a having the inverse-tapered cross section suitable for lift-off technique can be formed easily as shown in FIG. 2C.

The following is a description of the under bump metal film formed using pattern 28a described above.

First, piezoelectric substrate 21 having pattern 28a formed thereon is placed in a vacuum deposition apparatus and the vacuum deposition apparatus is evacuated. Piezoelectric substrate 21 is not heated or heated only up to 80° C. so as to prevent the lift-off photo-resist from being deformed by heat.

When the vacuum reaches, for example, $5 \times 10^{-4}$ Pa, a nitrogen-based gas is introduced into the vacuum deposition apparatus so as to adjust the vacuum to about 1 Pa. Next, a high voltage is applied between the vacuum deposition apparatus and the piezoelectric substrate, and then discharged for about 5 minutes. The deposited surface can be cleaned with plasma and ions generated so as to improve the adhesive strength of the deposited film. This process is called ion bombardment process.

The introduced nitrogen-based gas is evacuated from the vacuum deposition apparatus, and when the vacuum reaches $5 \times 10^{-4}$ Pa, the deposition of metals is performed using an EB (electron beam) gun.

First, a titanium film, which is adhesive with pad electrodes 23 on piezoelectric substrate 21, is formed in a thickness of about 100 nm as adhesive layer 24. While maintaining the vacuum state, an aluminum film is formed in a thickness of about 1000 nm as stress relaxation layer 25. Next, while maintaining the vacuum state, a nickel film is formed in a thickness of about 1000 nm as diffusion-resistant barrier layer 26. Then, while maintaining the vacuum state, a gold film is formed in a thickness of about 100 nm as solder wetting layer 27.

In general, an aluminum deposition film exposed in the air has an oxide film on its surface and becomes less adhesive with a metal film such as a nickel film. In the embodiment, however, the deposition of the aluminum film is followed by the deposition of the nickel film in the vacuum state. Thus, the nickel film is formed directly on the aluminum film without providing an adhesive layer therebetween, thereby reducing the stress of the nickel film.

Figure 2D:
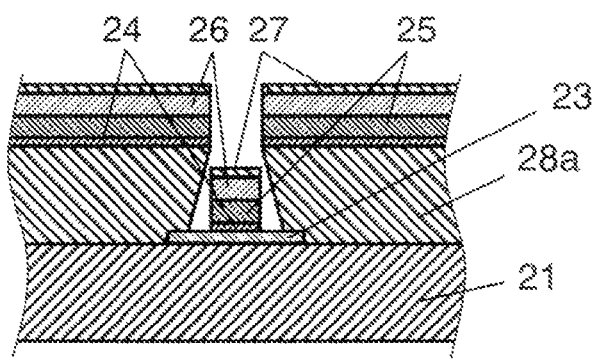
FIG. 2D is a sectional view showing another step of forming the under bump metal film according to the embodiment.

After the deposition of the gold film, the EB gun is cooled for about 10 minutes, and the vacuum apparatus is opened to the air. Piezoelectric substrate 21 having the metal film formed on the entire surface of piezoelectric substrate 21 as shown in FIG. 2D is removed from the vacuum apparatus.

Then, piezoelectric substrate 21 having the metal film formed on its entire surface is immersed in an NMP (N-Methyl-Pyrrolidone)-based organic solvent heated to about 60° C. so as to swell pattern 28a and remove pattern 28a from piezoelectric substrate 21. In this manner, the unnecessary metal film formed on pattern 28a can be removed. Next, piezoelectric substrate 21 from which pattern 28a has been removed is washed with water and dried in a rinser dryer.

Figure 2E:
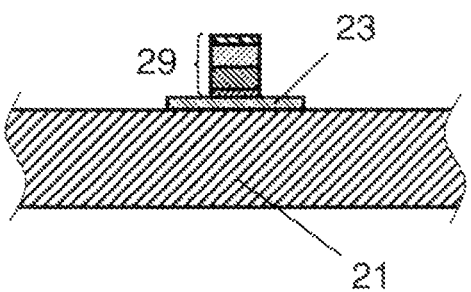
FIG. 2E is a sectional view showing another step of forming the under bump metal film according to the embodiment.

Through the aforementioned method, as shown in FIG. 2E, piezoelectric substrate 21 having predetermined under bump metal film 29 formed on pad electrode 23 is obtained.

According to the embodiment, a plurality of surface acoustic wave devices each having metal films on the piezoelectric substrate can be fabricated at one time. This improves the productivity of the surface acoustic wave devices, thereby contributing to the cost reduction of electronic components.

Surface acoustic wave devices on the piezoelectric substrate are diced into individual pieces and each flip-chip mounted on a mounting substrate that has lead-free solder bumps previously formed thereon. Then, these surface acoustic wave devices are packaged with resin or the like to avoid dust and dirt, thereby obtaining surface acoustic wave device products.

INDUSTRIAL APPLICABILITY

As described hereinbefore, the present invention enables a diffusion-resistant barrier layer having a sufficient thickness to be resistant to lead-free solder, and also having a low residual stress to be formed by evaporation-liftoff. The evaporation-liftoff technique can refine the under bump metal layer and simplify the fabrication process of the under bump metal film. Thus, the present invention is industrially useful.

The invention claimed is:

1. An under bump metal film on a pad electrode formed on a substrate, the under bump metal film comprising:
    a stress relaxation layer having a lower surface and an upper surface opposite to the lower surface, the lower surface being joined to the pad electrode, the stress relaxation layer being aluminum-based; and
    a diffusion-resistant barrier layer made of a platinum group metal film provided on the upper surface of the stress relaxation layer.

2. The under bump metal film of claim 1, wherein
    the diffusion-resistant barrier layer is made of nickel and has a thickness of at least 800 nm and at most 2000 nm.

3. The under bump metal film of claim 2, wherein
    the stress relaxation layer is at least half and at most 1.5 times as thick as the diffusion-resistant barrier layer.

4. The under bump metal film of claim 1, wherein
    the platinum group metal is at least one of platinum and palladium.

5. The under bump metal film of claim 1, wherein the diffusion-resistant barrier layer is formed substantially entirely on the upper surface of the stress relaxation layer.

6. The under bump metal film of claim 1, further comprising an adhesive layer joining the lower surface of the stress relaxation layer to the electrode, the adhesive layer being made of titanium.

* * * * *